United States Patent
Fukushima et al.

(10) Patent No.: US 6,582,767 B1
(45) Date of Patent: Jun. 24, 2003

(54) METAL PATTERN FORMING METHOD

(75) Inventors: Motoo Fukushima, Gunma-ken (JP); Eiichi Tabei, Gunma-ken (JP); Tomoyoshi Furihata, Gunma-ken (JP); Masaya Arakawa, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 36 days.

(21) Appl. No.: 09/702,852

(22) Filed: Nov. 1, 2000

(30) Foreign Application Priority Data

Nov. 1, 1999  (JP) ............................. 11-311215

(51) Int. Cl.$^7$ .............................. B05D 3/10; B05D 5/12; B05D 1/36; B05D 1/18
(52) U.S. Cl. ........................ 427/304; 427/98; 427/305; 427/306; 427/261; 427/402; 427/443.1
(58) Field of Search .................... 427/98, 304, 305, 427/306, 261, 402, 443.1

(56) References Cited

U.S. PATENT DOCUMENTS 5,512,131 A * 4/1996 Kumar et al. ............ 156/655.1

FOREIGN PATENT DOCUMENTS

JP          A10326957        12/1998

OTHER PUBLICATIONS

Kumar et al., "Patterning Self–Assembled Monolayers: Applications in Materials Science", LANGMUIR, American Chemical Society, vol. 10, p. 1498–1511 (1994).*

Fukushima et al., "Polysilanes as Conducting Material Producers and Their Application to Metal Pattern Formation of UV Light and Electroless Metallization", Synthetic Metals, Elsevier, vol. 97, p. 273–280, (1998).*

Hidber et al., American Chemical Society, vol. 12, pp. 1375–1380 (1996).

Hidber et al., American Chemical Society, vol. 12, pp. 5209–5215 (1996).

Fukushima et al., Synthetic Metals, vol. 97, pp. 273–280 (1998).

Kumar et al., American Chemical Society, vol. 10, pp. 1498–1511 (1994).

Xia et al., Angew. Chem. Int. Ed., vol. 37, pp. 550–575 (1998).

* cited by examiner

*Primary Examiner*—Michael Barr
(74) *Attorney, Agent, or Firm*—Birch, Stewart, Kolasch & Birch, LLP

(57) ABSTRACT

A method for forming a metal pattern by the micro-stamping process involves the steps of treating a substrate bearing a thin film of a reducing silicon polymer with a solution containing a salt of a metal having a standard oxidation-reduction potential of at least 0.54 volt, allowing metal colloid to deposit on the substrate surface, stamping a pattern of an alkane thiol to the substrate surface for transferring the pattern to the metal colloid-bearing silicon polymer thin film, and effecting electroless metal plating for forming a metal pattern only on the region of the silicon polymer thin film which is not covered with the alkane thiol pattern. The finely defined metal pattern can be formed on any type of substrate though inexpensive simple steps and has good adhesion to the substrate.

7 Claims, 1 Drawing Sheet

METAL PATTERN FORMING METHOD

This invention relates to a method for forming a metal pattern in accordance with a pattern transfer process using a stamp.

BACKGROUND OF THE INVENTION

Substrates having metal patterns formed thereon are used in a wide variety of applications including printed wiring boards, interdigital electrode substrates for sensors, flexible switches, battery electrodes, solar batteries, antistatic protective films, electromagnetic shield housings, integrated circuits, motor housings, and flat display panels.

Metallization on such substrates is traditionally carried out by vapor phase processes such as CVD and wet processes such as electroplating. Recently the electroless plating process is often employed.

Electroless plating was accidentally discovered by Brenner et al. in 1944 during electrolytic plating reaction in an aqueous solution of sodium hypophosphite. An electroless nickel plating process was reported in 1946 and a patent was granted to Brenner et al. See A. Brenner, J. of Research of N.B.S., 37, 1 (1946) and U.S. Pat. No. 2,532,283 (1950). Unlike electrolytic plating using an anode capable of feeding a metal, the electroless plating requires to replenish a metal salt and reducing agent which vary with the progress of metal deposition. The replenishing method was improved by G. Gutzeit et al (see G. Gutzeit et al., U.S. Pat. No. 2,658,841 (1953)). Such improved replenishment is now widely used in the industrial plating process. See W. H. Safranek, The Properties of Electrodeposited Metals and Alloys, 2nd Ed. American Electroplaters and Surface Finishers Soc., 1986. Since a metal is deposited under the action of a reducing agent, the electroless plating can form a continuous metal film even on non-conductive materials such as ceramics and plastics (see W. A. Alpaugh and C. Forks, U.S. Pat. No. 4,152,467 (1979)). However, the adhesion between the plated metal and the substrate largely depends on the type of substrate. Even when substrates are previously surface treated with carbon functional silanes (CF silanes) or surface roughened with acids or alkalis, some substrates allow for undesirable metal peeling.

Unlike polysiloxanes commonly used as heat resistant polymers in the industry, reducing silicon polymers such as polysilanes are quite interesting in that they possess UV absorption properties, high heat resistance, flexibility, and good thin film forming ability due to the metallic property and unique electron delocalization of silicon as compared with carbon.

The inventors discovered that when such a reducing silicon polymer is treated with a solution containing a salt of a metal having a standard oxidation-reduction potential of at least 0.54 volt, metal colloid readily deposits from the metal salt (Synthetic Metals, 97, 273, 1998). The inventors further disclosed in JP-A 10-326957 that by combining a thin film of reducing silicon polymer having such properties with metal colloid-catalyzed electroless plating, a metal film providing a firm bond to the substrate can be formed. Additionally, the inventors already proposed a method for forming a metal pattern on a substrate involving forming a pattern of reducing silicon polymer by a simple step such as a stamping, ink jet printing or lithographic printing technique. This method, however, is difficult to form a fine pattern of the micron order.

Patterning is generally carried out by the photolithography using resist which has developed in the semiconductor and micro-machining fields. This patterning method involves applying a resist to a substrate, exposing the resist coating to light through a mask, and etching or developing the resist coating by suitable means, thereby forming a fine pattern on the substrate. In general, a stepper is used for more efficient mass fabrication. The resolution depends on the wavelength of exposure light and the thickness of a resist film. To increase the degree of fineness, attempts have been made to reduce the wavelength of exposure light and the thickness of a resist film. Since such a process using an expensive stepper proceeds through a number of complicated steps by means of a precisely controlled apparatus, it is not readily implemented in a general purpose research laboratory.

As a result of the effort of reducing the film thickness to the limit in order to improve the degree of fineness, a molecular monolayer resist was recently developed. Since Colvert et al. formed in 1991 a molecular monolayer of organic silane compound using deep ultraviolet radiation of 193 nm, a number of molecular monolayers have been utilized in forming micro-patterns. See C. S. Dulcey, J. H. Georger, V. Krauthamer, T. L. Fare, D. A. Stenger, and J. M. Colvert, Science, 252, 551 (1991). The molecular monolayer used for forming a micro-pattern is known as a self-assembled monolayer (SAM) and utilizes the phenomenon that when a particular substrate is immersed in an organic solvent containing a specific molecule, a molecular monolayer spontaneously forms. See A. Ulman, An Introduction to Ultrathin Organic Films: From Langmuir-Blodgett to Self Assembly, Academic, Boston (1991). The molecular species is used in a particular combination with a substrate, for example, organic silane compounds such as R—Si(OR')$_3$ for metal oxide substrates such as $SiO_2$ and $Al_2O_3$; organic sulfur compounds such as alkane thiols (R—SH) and dialkyd disulfides (R—SS—R) for metal substrates such as gold, silver and copper; and alcohols (R—OH) and amines (R—NH$_2$) for platinum substrates.

Utilizing the self-assembled monolayer, Whitesides et al. proposed in 1994 a micro-stamping process for forming a micro-pattern by transferring an ink pattern onto a substrate using a silicone rubber stamp having indentations and protrusions, followed by etching. It was also reported to form a metal pattern by immersing a rubber stamp in a liquid dispersion of palladium colloid, pressing the rubber stamp against a substrate for transferring the palladium colloid on stamp protrusions to the substrate, and immersing the substrate in an electroless plating solution, whereby the metal deposits on only those areas where palladium colloid is attached. See A. Kumar, H. A. Biebuyck, G. M. Whitesides, Langmuir, 10, 1498 (1994), and Y. Xia, G. M. Whitesides, Angew. Chem. Int. Ed. Engl., 37, 575 (1998).

Nevertheless, this method could not use the stamp ink in a stable salt form such as palladium chloride, but the stamp ink in the form of palladium colloid which is formed by causing a reducing agent to act on palladium acetate. The palladium colloid is very unstable. Even when a surfactant such as tetraammonium halide is added for stabilizing the colloid, a uniform metal pattern is not always produced by stamping, owing to the influence of agglomerates and precipitates. Also the adhesion between metal and substrate largely varies with the type of substrate, so that accumulative strains are induced within a metal thin film depositing with the progress of plating, leading to the likelihood of peeling. See P. C. Hidber, W. Helbig, E. Kim, G. M. Whitesides, Langmuir, 12, 1375 (1996).

SUMMARY OF THE INVENTION

An object of the invention is to provide a method for forming a finely defined metal pattern having good adhesion though inexpensive simple steps without a need for exposure and development steps.

We have found that a finely defined metal pattern can be formed on any type of substrate at a firm bond to the substrate, by forming a thin film of a reducing silicon polymer on a substrate, immersing the substrate in a solution of a salt of a metal having a standard oxidation-reduction potential of at least 0.54 volt, typically palladium, silver or gold, forming a pattern of alkane thiol on the substrate by the micro-stamping process, and effecting electroless plating.

BRIEF DESCRIPTION OF THE DRAWING

The only figure, FIG. 1 illustrates a method of forming a fine metal pattern.

DESCRIPTION OF THE PREFERRED EMBODIMENT

Figure 1A:
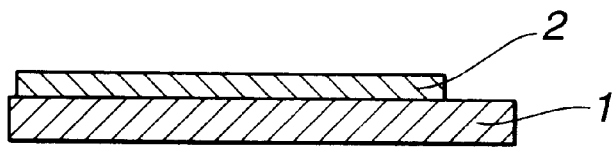
FIG. 1(A) illustrates a pattern of a reducing silicon polymer formed on a substrate.

The invention is directed to a method for forming on a substrate a finely defined metal pattern having good adhesion to the substrate, using the micro-stamping process of forming a micro-structure through simple steps including stamping for pattern transfer. The metal pattern forming method of the invention, which is based on the micro-stamping process of fabricating a micro-structure using a stamp for pattern transfer, involves the steps of treating a substrate bearing a thin film of a reducing silicon polymer on a surface thereof with a solution containing a salt of a metal having a standard oxidation-reduction potential of at least 0.54 volt, allowing metal colloid to deposit on the silicon polymer thin film; stamping a pattern of an alkane thiol to the substrate surface for transferring the pattern to the metal colloid-bearing silicon polymer thin film; and effecting electroless metal plating on the pattern-formed substrate for forming a metal pattern only on the region of the metal colloid-bearing silicon polymer thin film which is not covered with the alkane thiol pattern.

In one embodiment, the metal pattern forming method involves the steps of (1) applying a reducing silicon polymer to a substrate to form a silicon polymer thin film on a surface thereof; (2) treating the substrate resulting from step (1) with a solution containing a salt of a metal having a standard oxidation-reduction potential of at least 0.54 volt, allowing metal colloid to deposit on the silicon polymer thin film; (3) pressing a stamp having a corrugated pattern with an alkane thiol applied thereon against the substrate resulting from step (2) for transferring the pattern of alkane thiol onto the metal colloid-bearing silicon polymer thin film; and (4) effecting electroless metal plating on the substrate resulting from step (3) for forming a metal pattern only on the region of the metal colloid-bearing silicon polymer thin film which is not covered with the alkane thiol pattern.

The substrate used herein may be formed of insulating materials such as glass, ceramics and plastics, semiconductors such as silicon, and conductors such as copper. Since the silicon polymer is responsible for the adhesion between the substrate and a plated metal overlay, any desired substrate can be used without considering the material and surface state thereof. Even those resins and plastics which must otherwise be subject to surface roughening such as etching because of the lack of adhesiveness, for example, phenolic resins, polyester resins, epoxy resins, polyimide resins, and bismaleimide triazine resins, can be used without a need for surface roughening such as etching.

In step (1) according to the invention, a thin film of a reducing silicon polymer is formed on the substrate.

The reducing silicon polymer used herein is preferably selected from among polysilanes, polycarbosilanes, polysiloxanes and polysilazanes having Si—Si bonds or Si—H bonds. Of these, the polysilane having Si—Si bonds and the polysiloxane having hydrogen atoms attached directly to silicon atoms are preferred. The polysilane is especially preferred since it can be provided by photo-oxidation with first portions possessing a reducing action and second portions possessing no reducing action. A polysilane having Si—Si bonds in its backbone as represented by the following formula (1) is typical.

$$(R^1{}_m R^2{}_n X_p Si)_q \tag{1}$$

Herein $R^1$ and $R^2$ each are hydrogen or a substituted or unsubstituted aliphatic, alicyclic or aromatic hydrocarbon group, X is $R^1$, an alkoxy group, halogen atom, oxygen atom or nitrogen atom, m is a number of 0.1 to 1, n is a number of 0.1 to 1, p is a number of 0 to 0.5, the sum of m+n+p is from 1 to 2.5, and q is an integer of 2 to 100,000.

In the polysilane of formula (1), the aliphatic or alicyclic hydrocarbon groups represented by $R^1$ and $R^2$ are preferably of 1 to 12 carbon atoms, more preferably 1 to 6 carbon atoms, for example, methyl, ethyl, propyl, butyl, pentyl, hexyl, cyclopentyl and cyclohexyl. The aromatic hydrocarbon groups represented by $R^1$ and $R^2$ are preferably of 6 to 14 carbon atoms, more preferably 6 to 10 carbon atoms, for example, phenyl, tolyl, xylyl, naphthyl and benzyl. The substituted hydrocarbon groups are the above-exemplified unsubstituted hydrocarbon groups in which some or all of the hydrogen atoms are replaced by halogen atoms, alkoxy, amino, and aminoalkyl groups, for example, monofluoromethyl, trifluoromethyl, and m-dimethylaminophenyl. X is as defined for $R^1$, or an alkoxy group, halogen atom, oxygen atom or nitrogen atom. Exemplary alkoxy groups are those of 1 to 4 carbon atoms such as methoxy, ethoxy and isopropoxy. Exemplary halogen atoms are fluorine, chlorine and bromine. Most often, X is methoxy and ethoxy. The letter m is a number of from 0.1 to 1, especially from 0.5 to 1, n is a number of from 0.1 to 1, especially from 0.5 to 1, p is a number of from 0 to 0.5, especially from 0 to 0.2, the sum of m+n+p is from 1 to 2.5, especially from 1.5 to 2, and q is an integer of from 2 to 100,000, especially from 10 to 10,000.

The polysiloxane having hydrogen atoms attached directly to silicon atoms (that is, Si—H groups) is exemplified by a polymer having Si—H groups on side chains and Si—O—Si bonds in its backbone as represented by the following formula (2):

$$(R^1{}_r R^2{}_t H_u SiO_a)_s \tag{2}$$

wherein $R^1$ and $R^2$ each are hydrogen, a substituted or unsubstituted aliphatic, alicyclic or aromatic hydrocarbon group, alkoxy group or halogen atom, r is a number of 0.1 to 1, t is a number of 0.1 to 1, u is a number of 0.01 to 1, the sum of r+t+u is from 1 to 2.5 , "a" is a number of 0.01 to 1.5, and s is an integer of 2 to 100,000.

In the polysiloxane of formula (2), the aliphatic or alicyclic hydrocarbon groups represented by $R^1$ and $R^2$ are preferably of 1 to 12 carbon atoms, more preferably 1 to 6 carbon atoms, for example, methyl, ethyl, propyl, butyl, pentyl, hexyl, cyclopentyl and cyclohexyl. The aromatic hydrocarbon groups represented by $R^1$ and $R^2$ are preferably of 6 to 14 carbon atoms, more preferably 6 to 10 carbon atoms, for example, phenyl, tolyl, xylyl, naphthyl and benzyl. The substituted hydrocarbon groups are the above-exemplified unsubstituted hydrocarbon groups in which some or all of the hydrogen atoms are replaced by halogen atoms, alkoxy, amino, and aminoalkyl groups, for example, monofluoromethyl, trifluoromethyl, and m-dimethylaminophenyl. Exemplary alkoxy groups are those of 1 to 4 carbon atoms such as methoxy, ethoxy and isopropoxy. Most often, the alkoxy groups are methoxy and ethoxy. Exemplary halogen atoms are fluorine, chlorine and bromine. Letter r is a number of from 0.1 to 1, especially from 0.5 to 1, t is a number of from 0.1 to 1, especially from 0.5 to 1, u is a number of from 0.01 to 1, especially from 0.1 to 1, the sum of r+t+u is from 1 to 2.5, especially from 2 to 2.2, "a" is a number of from 0.01 to 1.5, especially from 0.1 to 1.5, and s is an integer of 2 to 100,000, especially from 10 to 10,000.

The reducing silicon polymer is usually dissolved in an organic solvent, with which the substrate is treated. Examples of the organic solvent in which the silicon polymer is dissolved include aromatic hydrocarbons such as benzene, toluene and xylene, aliphatic hydrocarbons such as hexane, octane and cyclohexane, ether solvents such as tetrahydrofuran and dibutyl ether, ester solvents such as ethyl acetate, and aprotic polar solvents such as dimethylformamide, dimethylsulfoxide and hexamethylphosphoric triamide, as well as nitromethane and acetonitrile. Of these, aromatic hydrocarbons such as toluene and xylene, and ether solvents such as tetrahydrofuran and dibutyl ether are preferred. The solution preferably has a concentration of 0.01 to 50% by weight, especially 1 to 20% by weight.

For improving the adhesion to the substrate, an inorganic powder such as fumed silica or a carbon functional silane (CF silane) of the following general formula (4) may be blended with the silicon polymer.

$$X-(CH_2)_b-SiR_c(OR)_d \quad (4)$$

Herein, X is a functional group such as vinyl, epoxy, amino or $NH_2CH_2CH_2NH-$, R is a monovalent hydrocarbon group, especially an alkyl group of 1 to 5 carbon atoms, c is equal to 0 or 1, d is equal to 2 or 3, c+d is equal to 3, and b is an integer of 0 to 3.

Illustrative examples of the CF silane are vinyltrimethoxysilane (KBM-1003), vinyltriethoxysilane (KBE-1003), β-(3,4-epoxycyclohexyl)ethyltrimethoxysilane (KBM-303), γ-glycidoxytrimethoxysilane (KBM-403), N-β-(aminoethyl)-γ-aminopropylmethyldimethoxysilane (KBM-602), N-β-(aminoethyl)-γ-aminopropyltrimethoxysilane (KBM-603), γ-aminopropyltrimethoxysilane (KBM-903), and γ-aminopropyltriethoxysilane (KBE-903), KBM and KBE being trade names by Shin-Etsu Chemical Co., Ltd. Preferred are amino group-containing CF silanes such as KBM-602, KBM-603, KBM-902, KBM-903, KBE-602, KBE-603, KBE-902 and KBE-903. The CF silane may be used in an amount of 0.01 to 200 parts by weight per 100 parts by weight of the silicon polymer. Less than 0.01 part of the CF silane may be ineffective for improving adhesion whereas more than 200 parts of the CF silane may be detrimental to film formation and rather detract from adhesion. The more desirable amount is 0.1 to 10 parts by weight.

A film of the reducing silicon polymer is formed by any desired technique, with conventional thin film forming techniques including spin coating, dipping, casting, vacuum evaporation and Langmuir-Blodgett techniques being employable. When it is desired to form a pattern of the reducing silicon polymer, a stamping process of stamping a solution of the reducing silicon polymer against the substrate using a stamp having protrusions is preferably employed. Alternatively, a thin film of the reducing silicon polymer is formed by spin coating or the like and selectively exposed to UV radiation such that the reducing capability is lost by photo-oxidation in unmasked areas while the reducing silicon polymer is left intact in the masked areas where no light has reached.

Thereafter, the substrate is advantageously held some time in a dry atmosphere or allowed to stand some time in vacuum at a temperature of about 40 to 60° C. The concentration of the solution is preferably 0.01 to 50% by weight, especially 1 to 20% by weight, whereby a thin film of the reducing silicon polymer can be formed to a thickness in the range of 0.001 to 10 μm, especially 0.01 to 3 μm.

In step (2), the substrate resulting from step (1) is treated with a solution containing a metal salt whereby metal colloid deposits on the substrate surface, exactly on the silicon polymer thin film.

The metal salt used herein is a salt of a metal having a standard oxidation-reduction potential of at least 0.54 volt, for example, a salt of gold (standard oxidation-reduction potential 1.50 V), palladium (standard oxidation-reduction potential 0.99 V) or silver (standard oxidation-reduction potential 0.80 V). A salt of a metal having a standard oxidation-reduction potential of lower than 0.54 volt such as copper (standard oxidation-reduction potential 0.34V) or nickel (standard oxidation-reduction potential –0.25 V) cannot be reduced by the silicon polymer. The metal salt is preferably water soluble.

More particularly, the preferred gold salts are salts of $Au^+$ and $Au^{3+}$, for example, $NaAuCl_3$, $NaAu(CN)_2$, and $NaAu(CN)_4$.

The preferred palladium salts are salts of $Pd^{2+}$ and generally represented by the formula: $Pd-Z_2$ wherein Z is a halogen such as Cl, Br or I, acetate, trifluoroacetate, acetylacetonate, carbonate, perchlorate, nitrate, sulfate or oxide. Exemplary palladium salts are $PdCl_2$, $PdBr_2$, $PdI_2$, $Pd(OCOCH_3)_2$, $Pd(OCOCF_3)_2$, $PdSO_4$, $Pd(NO_3)_2$, and PdO.

The preferred silver salts are salts of $Ag^+$ and generally represented by the formula: Ag—Z wherein Z is perchlorate, borate, phosphate or sulfonate. Exemplary silver salts are $AgBF_4$, $AgClO_4$, $AgPF_6$, $AgBPh_4$, $Ag(CF_3SO_3)$, and $AgNO_3$.

For the metal salt solution, use is made of a solvent in which the metal salt is fully soluble and which does not dissolve or attack the silicon polymer pattern. Such solvents are water, ketones such as acetone and methyl ethyl ketone, esters such as ethyl acetate, alcohols such as methanol and ethanol, and aprotic polar solvents such as dimethylformamide, dimethylsulfoxide and hexamethylphosphoric triamide, as well as nitromethane and acetonitrile. Water is most preferable. A halide such as hydrochloric acid or sodium chloride may be added to the solution for enhancing the stability thereof.

After the substrate is immersed in the metal salt solution, metal colloid deposits within about 1 to 10 minutes so that only the area where the reducing silicon polymer film is present change its color to gray, brown or light purple in correspondence with palladium, silver or gold. The treated substrate is then washed by immersing for about 1 second to 10 minutes in a solvent free of the metal salt, and dried, yielding the substrate on the surface of which the metal salt has been reduced into metal colloid in only the reducing silicon polymer film-covered area. If necessary, the substrate is heat treated at a temperature of 35 to 150° C. for promoting the reduction into metal colloid on the reducing silicon polymer film surface. The drying is generally effected at a temperature of about 10 to 150° C. under atmospheric pressure or vacuum.

In pattern transfer step (3), a pattern of an alkane thiol is formed on the substrate by the micro-stamping process.

The micro-stamping process utilizing a self-assembled monolayer involves transferring an ink pattern to a substrate by way of a rubber stamp, and etching the pattern to form a finely defined pattern. The process has the following advantages.

A single rubber plate having a corrugated pattern of protrusions and indentations is pressed against a number of substrates to form a number of patterned substrates, leading to the ease of mass manufacture. The rubber plate having a corrugated pattern is prepared from a single master substrate having a corrugated pattern. For the fabrication of the master substrate, the aspect of mass manufacture need not be considered and a choice may be made among a wide range of means including light and electron beams. Even when light is used, an expensive arrangement such as a stepper is unnecessary because only one master substrate is to be fabricated. For the rubber plate, there may be used a commercially available mold-forming silicone rubber. The master substrate having a corrugated pattern may be prepared in accordance with a conventional photoresist technique by applying a resist to a silicon wafer, exposing the resist to UV radiation through a quartz photomask having a fine pattern, followed by development to form a silicon wafer master.

The rubber plate having a corrugated pattern must temporarily carry the alkane thiol on its pattern and allow the pattern to be faithfully transferred to the substrate. Use may be made of silicone rubber, fluorosilicone rubber and fluororubber which are least swellable and have an appropriate hardness and good parting property.

The preferred alkane thiol used herein is represented by the following formula (3):

$$RSH \quad (3)$$

wherein R is a substituted or unsubstituted aliphatic, alicyclic or aromatic hydrocarbon group. It is especially desired that the portion where the alkane thiol pattern is formed be lipophilic. In this regard, R may be a lipophilic group such as a long-chain alkyl group, specifically a substituted or unsubstituted aliphatic, alicyclic or aromatic hydrocarbon group of 6 to 25 carbon atoms. Exemplary, preferred alkane thiols are 1-octanethiol having 8 carbon atoms, 1-decanethiol having 10 carbon atoms, 1-hexadecanethiol having 16 carbon atoms, and 1-octadecanethiol having 18 carbon atoms.

On use, the alkane thiol is dissolved in a suitable organic solvent, if necessary. Examples of the organic solvent include aromatic hydrocarbons such as benzene, toluene and xylene, ether solvents such as tetrahydrofuran and dibutyl ether, alcohols solvents such as methanol and ethanol, alkoxyethanol solvents such as ethyl cellosolve and methyl cellosolve, ketone solvents such as acetone and methyl ethyl ketone, ester solvents such as ethyl acetate, butyl acetate, methyl lactate and ethyl lactate, and ether ester solvents such as PEGMIA. An appropriate amount of the solvent used is 0 to 10,000 parts by weight per 100 parts by weight of the alkane thiol. For improving the adhesion to the substrate, an inorganic powder such as fumed silica or a CF silane such as γ-aminopropyltrimethoxysilane (KBM-903) and γ-aminopropyltriethoxysilane (KBE-903) may be blended with the alkane thiol.

In step (3), a stamp having the alkane thiol applied to its protrusions is pressed against the substrate resulting from step (2), exactly the metal colloid layer, for transferring the pattern of alkane thiol from the stamp onto the metal colloid-bearing silicon polymer thin film. In the subsequent electroless plating step, the alkane thiol-transferred portion ceases to be catalytic nuclei for the deposition of electroless plating metal whereas only the metal colloid which is not covered with the alkane thiol acts as catalytic nuclei for the deposition of electroless plating metal.

Using the alkane thiol solution having an appropriate concentration of about 0.1 to 50% by weight, a patterned alkane thiol film can be formed to a thickness in the range of about 0.001 to 1 μm.

After the alkane thiol pattern is formed, it is advantageously dried by holding some time in a dry atmosphere or by holding in vacuum at a temperature of about 40 to 150° C.

In step (4), electroless metal plating is effected on the substrate resulting from step (3) for depositing a metal only on the region of the silicon polymer thin film that is not covered with the alkane thiol pattern.

More particularly, the substrate is immersed in an electroless plating solution. The metal colloid acts as a catalyst in forming a plated metal film. The electroless plating solution contains metal ions of copper, nickel, palladium, gold, platinum or rhodium, with copper and nickel ions being preferred. In addition to the metal salt, the electroless plating solution generally contains reducing agents such as sodium hypophosphite, hydrazine and sodium boron hydride, carboxylic acids or water-soluble salts thereof such as sodium acetate, sodium citrate, sodium succinate, and sodium potassium tartrate, amines such as ethylene diamine, phenylene diamine and EDTA, complexing agents for the above-mentioned metals, and stabilizers such as lead salts. Electroless plating solutions are commercially available at a low cost. The plating conditions include a temperature of about 15 to 100° C. and a contact time of about 1 minute to 16 hours, and more desirably about 25 to 85° C. and about 1 to 60 minutes.

Finally, optional steps such as UV irradiation and heating are carried out for improving the adhesion of the plated metal to the substrate. For example, heat treatment is advantageously carried out in a reducing atmosphere (e.g., hydrogen), inert atmosphere (e.g., argon) or vacuum, at 60 to 300° C. for about 10 minutes to 24 hours. Then the metal film formed by electroless plating possesses a higher conductivity and hardness as well as better adhesion to the substrate.

According to the invention, a finely defined metal pattern can be formed on any type of substrate though inexpensive simple steps and the metal pattern has good adhesion to the substrate. The substrates having metal patterns formed thereon are used in a wide variety of applications including printed wiring boards, flexible switches, battery electrodes, solar batteries, sensors, antistatic protective films, electromagnetic shield housings, integrated circuits, motor housings, and flat display panels. The method is thus useful in the electric, electronic and communication fields.

EXAMPLE

Examples of the invention are given below by way of illustration and not by way of limitation.

Synthesis Example 1

Preparation of Reducing Silicon Polymer

Phenylhydrogenpolysilane (PPHS) was prepared by the following procedure.

A diethyl ether solution of methyl lithium was added to bis(cyclopentadienyl)dichlorozirconium in an argon-purged flask whereby bis(cyclopentadienyl)dimethylzirconium serving as a catalyst was formed within the system. Phenylsilane was added to the flask in a molar amount of 50 times the molar amount of the catalyst. The mixture was heated and agitated at 100° C. for 24 hours. Thereafter, molecular sieves were added to the reaction solution whereupon the catalyst was removed by filtration. This yielded a substantially quantitative amount of phenylhydrogenpolysilane (PPHS) having a weight average molecular weight of 2,600 in solid form.

Preparation Example 1

Preparation of Silicon Wafer Master

A resist (SIPR-9740 by Shin-Etsu Chemical Co., Ltd.) was coated onto a silicon wafer, exposed to ultraviolet radiation of 375 nm in an exposure dose of 200 mJ/cm$^2$ through a quartz photomask having a 0.5–2 mm line-and-space pattern or a 1–10 μm line-and-space pattern, and developed once for 50 seconds with a 2.38% aqueous solution of tetramethylammonium hydroxide (TMAH), thereby forming a pattern. This was etched with hydrofluoric acid. There were obtained two silicon wafer masters having a 0.5–2 mm line-and-space pattern and a 1–10 μm line-and-space pattern, respectively.

Preparation Example 2

Preparation of Silicone Rubber Master

Mold-forming silicone rubber KE-1300 by Shin-Etsu Chemical Co., Ltd. was used. 100 g of KE-1300T and 10 g of Cat-1300 were thoroughly mixed, deaerated in vacuum, cast onto the line-and-space pattern on the silicon substrate secured in an aluminum dish, and allowed to stand for 24 hours at room temperature for curing. Following the curing, the rubber was slowly stripped from the silicon wafer master. In this way, there were obtained two silicone rubber master stamps having a 0.5–2 mm line-and-space pattern and a 1–10 μm line-and-space pattern transferred to the silicone rubber, respectively.

Example 1

In 9.6 g of toluene was dissolved 0.4 g of a reducing silicon polymer (that is phenylhydrogenpolysilane (PPHS) prepared in Synthesis Example 1). Using this reducing silicon polymer solution and the silicone rubber master stamp having a 0.5–2 mm line-and-space pattern, a pattern 2 of the reducing silicon polymer was formed on a glass fiber-reinforced epoxy resin substrate 1 in accordance with the stamping process, as shown in FIG. 1(A). The pattern was dried at 2 mmHg and 50° C. (Step 1).

Figure 1B:
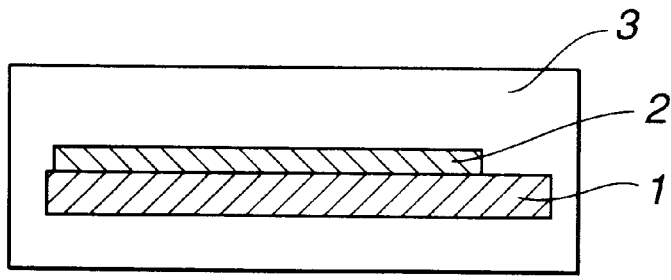
FIG. 1(B) illustrates that the substrate is immersed in a palladium chloride solution whereby palladium colloid deposits on the silicon polymer film.

Next, as shown in FIG. 1(B), a 3% aqueous solution of palladium chloride was prepared. The substrate 1 was dipped in the solution for one minute and washed with water. Palladium colloid formed only on the PPHS pattern 2, forming a gray 0.5–2 mm line-and-space pattern (Step 2).

Figure 1C:
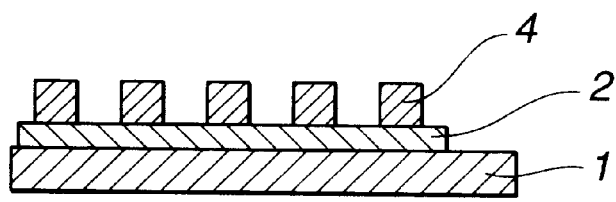
FIG. 1(C) illustrates that a pattern of alkane thiol is formed on the palladium colloid-bearing silicon polymer film by the micro-stamping process.

Next, 1.0 g of an alkane thiol, specifically 1-hexadecanethiol (HDT) was dissolved in 32.3 g of ethanol. In accordance with the micro-stamping process, the HDT solution was applied to protrusions of the silicone rubber master stamp having a 1–10 μm line-and-space pattern. The stamp was pressed against the glass fiber-reinforced epoxy resin substrate 1 resulting from Step 2. In this way, a pattern 4 of HDT was formed on the substrate 1 such that the pattern 4 was perpendicular to the gray 0.5–2 mm line-and-space pattern as shown in FIG. 1(C), and then dried at 2 mmHg and 50° C. (Step 3).

Figure 1D:
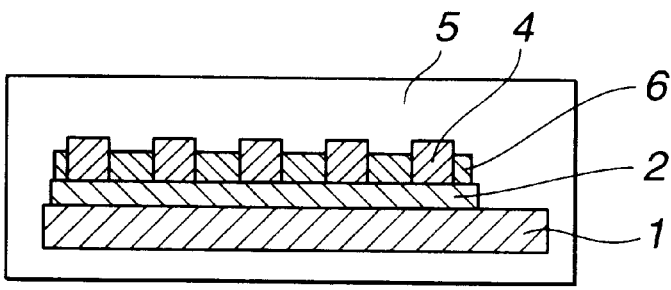
FIG. 1(D) illustrates that the substrate is immersed in an electroless nickel plating solution whereby a nickel metal pattern is formed.
Figure 1E:
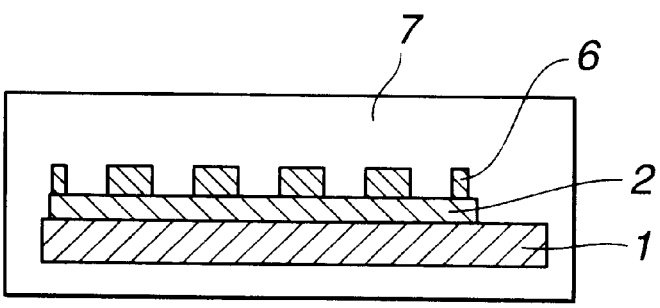
FIG. 1(E) illustrates that the substrate is heat treated in an electric furnace for stabilizing the plated film.
Figure 1F:
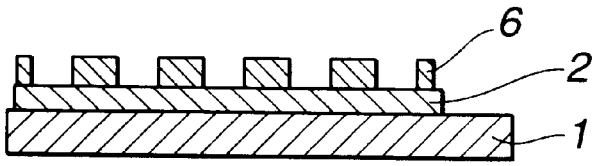
FIG. 1(F) illustrates the metal pattern-bearing substrate.

Finally, as shown in FIG. 1(D), the substrate was dipped in an electroless nickel plating solution at 80° C. for 10 minutes. The electroless nickel plating solution contained 20 g of nickel sulfate, 10 g of sodium hypophosphite and 30 g of sodium acetate in 1,000 g of water. A nickel metal pattern 6 was formed. After washing with pure water, the substrate was dried at 60° C. for 5 minutes. Thereafter, as shown in FIG. 1(E), the substrate was placed in an electric furnace 7 where it was heat treated in nitrogen at a temperature of 150° C. for ½ hour. As shown in FIG. 1(F), there was obtained the glass fiber-reinforced epoxy resin substrate 1 having a nickel pattern 6 (Step 4).

The nickel portion was formed only on the gray 0.5–2 mm line-and-space pattern and outside the 1–10 μm line-and-space pattern on the substrate. The adhesion of the nickel pattern to the substrate was examined by a tape peeling test. No peel occurred over all the 1–10 μm lines. It is noted that the HDT disappeared by the heat treatment in the electric furnace.

Comparative Example

The procedure of Example 1 was repeated except that instead of Steps 1 and 2, a palladium colloid ethanol dispersion was prepared by reducing palladium acetate with ethanol, and using the silicone rubber master stamp having a 0.5–2 mm line-and-space pattern, a pattern of palladium colloid was formed. The resulting nickel pattern was apparently similar to that of Example 1, but readily peeled when nickel adhesion was examined by a tape peeling test.

Example 2

In 9.2 g of toluene were dissolved 0.8 g of PPHS and 8 mg of a CF silane in the form of KBM-603 (corresponding to 1 part by weight of CF silane per 100 parts by weight of reducing silicon polymer). Using this PPHS solution and the silicone rubber master stamp having a 0.5–2 mm line-and-space pattern, a pattern of PPHS was formed on a glass substrate in accordance with the stamping process. The pattern was dried at 2 mmHg and 50° C.

Next, a 3% aqueous solution of palladium chloride was prepared. The substrate 1 was dipped in the solution for one minute and washed with water. HDT, 1.0 g, was dissolved in 32.3 g of ethanol. In accordance with the micro-stamping process, the HDT solution was applied to protrusions of the silicone rubber master stamp having a 1–10 μm line-and-space pattern. The stamp was pressed against the treated glass substrate. In this way, a HDT pattern was formed on the substrate such that the pattern was perpendicular to the gray 0.5–2 mm line-and-space pattern, and then dried at 2 mmHg and 50° C. The substrate was then dipped in an electroless nickel plating solution of the same composition as in Example 1 at 80° C. for 10 minutes, forming a nickel metal pattern. After washing with pure water, the substrate was dried at 60° C. for 5 minutes. Thereafter, the substrate was heat treated in nitrogen at a temperature of 150° C. for ½ hour. There was obtained the glass substrate having a nickel pattern.

The nickel portion was formed only on the gray 0.5–2 mm line-and-space pattern and outside the 1–10 μm line-and-space pattern on the substrate. The adhesion of the nickel pattern to the substrate was examined by a tape peeling test. No peel occurred over all the 1–10 μm lines.

Japanese Patent Application No. 11-311215 is incorporated herein by reference.

Reasonable modifications and variations are possible from the foregoing disclosure without departing from either the spirit or scope of the present invention as defined by the claims.

What is claimed is:

1. In a method for forming a metal pattern by a micro-stamping process of fabricating a micro-structure by using a stamp for transferring a pattern, comprising the steps of: treating a substrate bearing a thin film of a reducing silicon polymer on a surface thereof, said thin film having a thickness in the range 0.001 to 10 μm, with a salt of a metal having a standard oxidation-reduction potential of at least 0.54 volt, stamping a pattern of an alkanethiol to the substrate surface for transferring the pattern to the metal colloid-bearing silicon polymer thin film, and effecting electroless metal plating for forming a metal pattern only on the region of the silicon polymer thin film which is not covered with the alkanethiol pattern, the improvement which comprises treating the substrate bearing the thin film of reducing silicon polymer on its surface with an aqueous solution containing said metal salt, thereby allowing metal colloid to deposit on the silicon polymer thin film, wherein the silicon polymer film on the substrate is not subjected to ultraviolet light lithography prior to treatment with the metal salt solution.

2. A method for forming a metal pattern, comprising the steps of:

(1) applying a reducing silicon polymer to a substrate to form a silicon polymer thin film having a thickness in the range 0.001 to 10 μm on a surface thereof, (2) without subjecting the silicon polymer film on the substrate to ultraviolet light lithography, treating the substrate resulting from step (1) with a solution comprising a salt of a metal having a standard oxidation-reduction potential of at least 0.54 volt and water, and, without isolating metal colloid from the solution, allowing metal colloid to deposit on the silicon polymer thin film, (3) pressing a stamp having a corrugated pattern with an alkanethiol applied thereon against the substrate resulting from step (2) for transferring the pattern of alkanethiol onto the metal colloid-bearing silicon polymer thin film, and (4) effecting electroless metal plating on the substrate resulting from step (3) for forming a metal pattern only on the region of the silicon polymer thin film which is not covered with the alkanethiol pattern.

3. The method of claim 1, wherein the reducing silicon polymer has Si—Si bonds or Si—H bonds and is selected from the group consisting of polysilanes, polycarbosilanes, polysiloxanes, and polysilazanes.

4. The method of claim 3, wherein the polysilane having Si—Si bonds is represented by the following formula (1):

$$(R^1_m R^2_n X_p Si)_q \tag{1}$$

wherein $R^1$ and $R^2$ each are hydrogen or a substituted or unsubstituted aliphatic, alicyclic, or aromatic hydrocarbon group, X is selected from the group consisting of $R^1$, an alkoxy group, halogen atom, oxygen atom, and nitrogen atom, m is a number of 0.1 to 1, n is a number of 0.1 to 1, p is a number of 0 to 0.5, the sum of m+n+p is from 1 to 2.5, and q is an integer of 2 to 100,000.

5. The method of claim 3, wherein the polysiloxane having Si—H bonds is represented by the following formula (2):

$$(R^1_r R^2_t H_u SiO_a)_s \tag{2}$$

wherein $R^1$ and $R^2$ each are hydrogen, a substituted or unsubstituted aliphatic, alicyclic, or aromatic hydrocarbon group, alkoxy group, or halogen atom, r is a number of 0.1 to 1, t is a number of 0.1 to 1, u is a number of 0.01 to 1, the sum of r+t+u is from 1 to 2.5, "a" is a number of 0.01 to 1.5, and s is an integer of 2 to 100,000.

6. The method of claim 3, wherein the metal having a standard oxidation-reduction potential of at least 0.54 volt is palladium, silver, or gold.

7. The method of claim 1, wherein the alkane thiol is represented by the following formula (3):

$$RSH \tag{3}$$

wherein R is a substituted or unsubstituted aliphatic, alicyclic, or aromatic hydrocarbon group.

* * * * *